United States Patent
Honda et al.

(10) Patent No.: US 8,324,968 B2
(45) Date of Patent: Dec. 4, 2012

(54) AMPLIFIER CIRCUIT, SIGNAL PROCESSOR CIRCUIT, AND SEMICONDUCTOR INTEGRATED CIRCUIT DEVICE

(75) Inventors: Kazutaka Honda, Chiryu (JP); Tetsuya Makihara, Nukata-gun (JP); Masakiyo Horie, Gamagori (JP)

(73) Assignee: DENSO CORPORATION, Kariya (JP)

( * ) Notice: Subject to any disclaimer, the term of this patent is extended or adjusted under 35 U.S.C. 154(b) by 45 days.

(21) Appl. No.: 13/075,227

(22) Filed: Mar. 30, 2011

(65) Prior Publication Data

US 2011/0241780 A1    Oct. 6, 2011

(30) Foreign Application Priority Data

Apr. 1, 2010  (JP) ................................ 2010-85151

(51) Int. Cl.
*H03F 3/45*  (2006.01)
(52) U.S. Cl. ..................... 330/258; 330/51; 330/301
(58) Field of Classification Search .................. 330/258, 330/51, 301
See application file for complete search history.

(56) References Cited

U.S. PATENT DOCUMENTS

| | | | |
|---|---|---|---|
| 4,494,077 A | 1/1985 | Fukaya | |
| 4,574,250 A * | 3/1986 | Senderowicz | 330/258 |
| 5,243,623 A | 9/1993 | Murdock | |
| 5,394,080 A | 2/1995 | Rijns | |
| 6,054,876 A | 4/2000 | Horie et al. | |
| 6,529,070 B1 | 3/2003 | Nagaraj | |
| 6,608,527 B2 * | 8/2003 | Moloudi et al. | 330/301 |
| 6,624,698 B2 | 9/2003 | Nagaraj | |
| 6,750,704 B1 * | 6/2004 | Connell et al. | 330/9 |
| 7,268,623 B2 * | 9/2007 | Kim et al. | 330/253 |
| 7,312,660 B2 * | 12/2007 | Koh et al. | 330/260 |
| 7,408,402 B2 | 8/2008 | Nishimura | |
| 7,626,524 B2 | 12/2009 | Horie | |
| 7,642,852 B2 * | 1/2010 | Chandra et al. | 330/258 |
| 7,816,992 B2 | 10/2010 | Tanaka et al. | |
| 7,924,089 B2 | 4/2011 | Tanaka et al. | |

FOREIGN PATENT DOCUMENTS

| | | |
|---|---|---|
| JP | A-02-234504 | 9/1990 |
| JP | A-2008-102091 | 5/2008 |
| JP | A-2008-216135 | 9/2008 |

OTHER PUBLICATIONS

Office Action mailed Mar. 21, 2012 in corresponding JP Application No. 2010-085151 (and English translation).

* cited by examiner

*Primary Examiner* — Patricia Nguyen
(74) *Attorney, Agent, or Firm* — Posz Law Group, PLC

(57) ABSTRACT

An amplifier circuit is provided to be switchable between a single end output configuration and a differential output configuration without increasing a circuit area. When first and fourth switches are turned off and a second switch is turned on, a load circuit functions as an active load on a differential pair and a first output terminal is internally disconnected. The amplifier circuit is provided with a single end output configuration and differentially amplifies input voltages inputted to input terminals and outputs an imbalanced signal from a second output terminal. When the first and fourth switches are turned on and the second switch is turned off, the load circuit functions as a load on the differential pair and the first output terminal is internally connected. The amplifier circuit is provided with a differential output configuration and differentially amplifies the input voltages inputted to the input terminals and outputs balanced signals from the output terminals.

11 Claims, 12 Drawing Sheets

AMPLIFIER CIRCUIT, SIGNAL PROCESSOR CIRCUIT, AND SEMICONDUCTOR INTEGRATED CIRCUIT DEVICE

CROSS REFERENCE TO RELATED APPLICATION

This application is based on and incorporates herein by reference Japanese patent application No. 2010-85151 filed on Apr. 1, 2010.

FIELD OF THE INVENTION

The present invention relates to an amplifier circuit that differentially amplifies and outputs signals inputted through differential input transistors in a differential pair, a signal processor circuit including the amplifier circuit, and a semiconductor integrated circuit device including the amplifier circuit.

BACKGROUND OF THE INVENTION

Of conventional capacitive sensors, for example, some are single end output type and the other of the capacitive sensors are differential output type. As for C-V converter circuits that convert sensor output signals into voltages, some are configured to use an amplifier circuit with a single end configuration and the other are configured to use an amplifier circuit with a differential configuration. (Refer to JP-2008-216135A, for example.) For this reason, the specifications of an amplifier circuit forming a C-V converter circuit therein are determined in correspondence to the output method (form) of a sensor used. Therefore, when the specifications of a sensor used are changed, it is necessary to change the specifications (circuit configuration) of an amplifier circuit forming the C-V converter according to such changes.

Many A/D converters incorporated into a microcomputer are of single end input type and many discrete A/D converters are of differential input type. For this reason, when an analog signal outputted from a signal processor circuit is converted to a digital signal, it is necessary to take the output method (single end output or differential output) of an amplifier circuit forming the output stage of the signal processor circuit according to the input method of the A/D converter used.

For the purpose of shortening an integrated circuit (IC) development period, reducing total costs, and the like, IC modules in which the functions of an analog circuit as well as a digital circuit are programmable are under development. In such an IC module, an amplifier circuit (amplifier) whose signal output form or method can be dynamically switched may be required.

In both cases where a sensor is of single end output type and where it is of differential output type, a C-V converter circuit using an amplifier circuit with a differential configuration could be used in common. This makes it unnecessary to change the specifications of the amplifier circuit according to the output method of the sensor. In this case, however, an input common mode feedback circuit is required to keep the common mode level of input signals supplied to each input terminal of the amplifier circuit at a predetermined level. For this reason, when a sensor of single end output type is used, an input common mode feedback circuit that is otherwise unnecessary is necessary in a C-V converter circuit using an ordinary amplifier circuit with a single end configuration. This accordingly increases the circuit area.

SUMMARY OF THE INVENTION

It is an object of the present invention to provide an amplifier circuit having a function of switching its configuration between single end output configuration and differential output configuration without increasing a circuit area, a signal processor circuit including such an amplifier circuit, and a semiconductor integrated circuit device including such and amplifier circuit.

According to the present invention, an amplifier circuit comprises differential input transistors, a current supply circuit, a load circuit, a load switching circuit and an output switching circuit. The differential input transistors form a differential pair. The current supply circuit supplies a predetermined current to the differential input transistors. The load circuit is switchable between a first state and a second state. The load circuit functions as an active load on the differential input transistors in the first state and functions as a load on the differential input transistors in the second state. The load switching circuit switches the load circuit to the first state when a first switching signal is supplied, and switches the load circuit to the second state when a second switching signal is supplied. The output switching circuit causes a differential amplification signal produced through one of common connection nodes between the differential input transistors and the load circuit to be outputted when the first switching signal is supplied, and causes the differential amplification signal produced through both of the common connection nodes between the differential input transistors and the load circuit to be outputted when the second switching signal is supplied.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
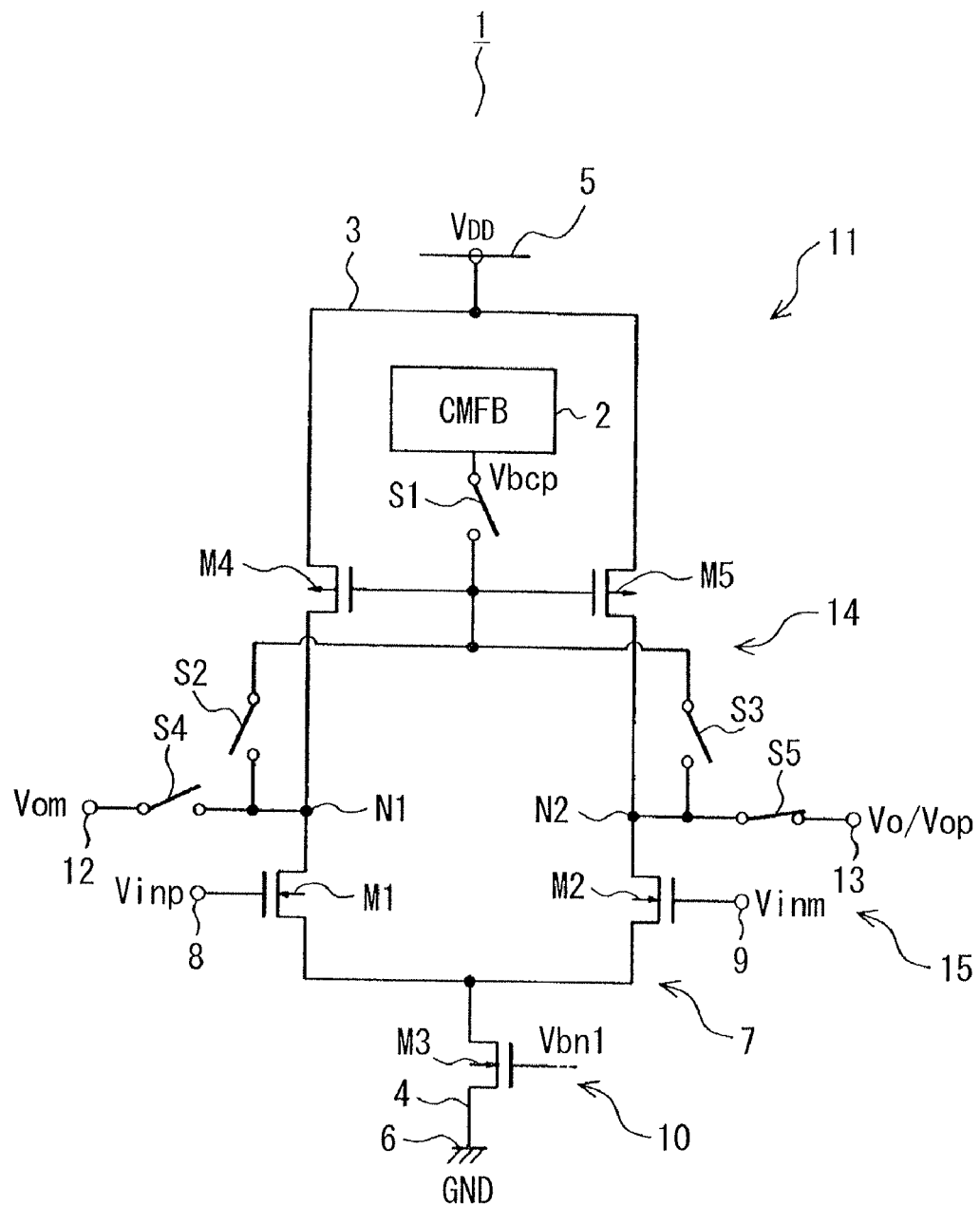
FIG. 1 is an electric circuit diagram of an amplifier circuit according to a first embodiment of the invention.

Referring to FIG. 1, an amplifier circuit 1 is used in a semiconductor integrated circuit device (IC) incorporated in, for example, an in-vehicle electronic control section (ECU). The amplifier circuit 1 includes MOS transistors M1 to M5, switches S1 to S5, and a common mode feedback (CMFB) circuit 2. Between power supply lines 3, 4, power supply voltage VDD (for example, 5V) is supplied through power supply terminals 5, 6.

N-channel MOS transistors M1, M2 (corresponding to differential input transistors) form a differential pair 7. Between the commonly connected source of the transistors M1, M2 and the power supply line 4, a n-channel MOS transistor M3 is connected. The gates of the transistors M1, M2 are respectively connected to an input terminal 8 (corresponding to a non-inverting input terminal) for input voltage Vinp and an input terminal 9 (corresponding to an inverting input terminal) for input voltage Vinm. To the gate of the transistor M3, appropriate (optimum) bias voltage Vbn1 is applied. Thus the transistor M3 functions as a current supply circuit 10 that supplies a certain current to the differential pair 7.

Between the power supply line 3 and the drains of the transistors M1, M2, p-channel MOS transistors M4, M5 are respectively connected. The commonly connected source (corresponding to one main terminal) of the transistors M4, M5 is connected to the power supply line 3. The transistors M4, M5 (corresponding to load transistors) form a load circuit 11 together with the CMFB circuit 2. This load circuit 11 can be switched between a first state, in which it operates as an active load on the differential pair 7, and a second state, in which it operates as a load on the differential pair 7.

The output terminal of the CMFB circuit 2 is connected to the commonly connected gate (corresponding to a control terminal) of the transistors M4, M5 through the switch S1 (corresponding to a third load changing switch). Between the gate and the drain of the transistor M4, the switch S2 (corresponding to a first load changing switch) is connected. Between the gate and the drain of the transistor M5, the switch S3 (corresponding to a second load changing switch) is connected. These switches S1 to S3 function as a load switching circuit 14.

The drains (corresponding to the other main terminal) of the transistors M4, M5 are respectively connected to the drains of the transistors M1, M2. The common connection node N1 between the transistors M1, M4 is connected to an output terminal 12 (corresponding to a first output terminal) that functions as an inverting output terminal through the switch S4 (corresponding to a first output changing switch). The common connection node N2 between the transistors M2, M5 is connected to an output terminal 13 (corresponding to a second output terminal) that functions as a non-inverting output terminal or an output terminal through the switch S5 (corresponding to a second output changing switch). These switches S4, S5 function as an output changing circuit 15.

The CMFB circuit 2 (corresponding to a potential applying circuit and an in-phase feedback circuit) has a well-known configuration using a switched capacitor. The CMFB circuit 2 may have any other configuration. The CMFB circuit 2 detects the common mode level (neutral point potential) of balanced signals Vom, Vop outputted from the output terminals 12, 13. Then it controls outputted bias voltage Vbcp (corresponding to a predetermined potential) so as to match a resulting detection value with a predetermined value. This predetermined value is set to ½ of the power supply voltage VDD, for example, that is, to 2.5V. The predetermined value may be changed as appropriate.

The switches S1 to S5 are formed of, for example, analog switches with a CMOS configuration. The switches S1, S4 and the switch S2 complementarily operate according to the level of an externally supplied mode switching signal. Specifically, when a mode switching signal is at the high level (H level), the switches S1, S4 are turned off and the switch S2 is turned on. When a mode switching signal is at the low level (L level), the switches S1, S4 are turned on and the switch S2 is turned off. The switch S3 is fixed at the off-state regardless of the level of the mode switching signal. The switch S5 is fixed at the on-state regardless of the level of the mode switching signal. That is, the switches S3, S5 are provided as dummy switches that do not contribute to the switching operation of the circuitry at all.

The thus configured amplifier circuit 1 functions as an amplifier circuit with a single end output configuration when the externally supplied mode switching signal is at the H level. When the mode switching signal of the H level (corresponding to the first switching signal) is supplied, the switch S1 is turned off and the switch S2 is turned on. As a result, the transistors M4, M5 form a current mirror circuit. That is, the load circuit 11 functions as an active load on the transistors M1, M2. When the switch S4 is turned off, the output terminal 12 is disconnected in the amplifier circuit 1. As a result, the amplifier circuit 1 is provided with a single end output configuration. That is, it differentially amplifies the input voltages Vinp, Vinm inputted to the input terminals 8, 9 and outputs an imbalanced signal Vo (differential amplification signal) generated by this differential amplification from the output terminal 13.

The amplifier circuit 1 functions as an amplifier circuit with a differential output configuration, when the mode switching signal is at the L level. When the mode switching signal of the L level (corresponding to the second switching signal) is supplied, the switch S1 is turned on and the switch S2 is turned off. As a result, the commonly connected gate of the transistors M4, M5 is supplied with a predetermined bias voltage Vbcp from the CMFB circuit 2. Then the load circuit 11 functions as a load on the transistors M1, M2. When the switch S4 is turned on, the output terminal 12 is connected in the amplifier circuit 1. As a result, the amplifier circuit 1 is provided with the differential output configuration. That is, it differentially amplifies the input voltages Vinp, Vinm inputted to the input terminals 8, 9 and outputs the balanced signals Vom, Vop generated by this differential amplification from the output terminals 12, 13.

The amplifier circuit 1 can thus be operated with a configuration selected from the single end output configuration and the differential output configuration by changing the switching states of the switches S1, S2, S4 according to the level of the externally supplied mode switching signal. That is, the amplifier circuit 1 has a function of switching its configuration between the single end output configuration and the differential output configuration.

The amplifier circuit 1 with the above configuration is applied to C-V converter circuits that convert output signals of a capacitive sensor into voltage signals as shown in FIG. 2A to FIG. 2D.

Figure 2A:
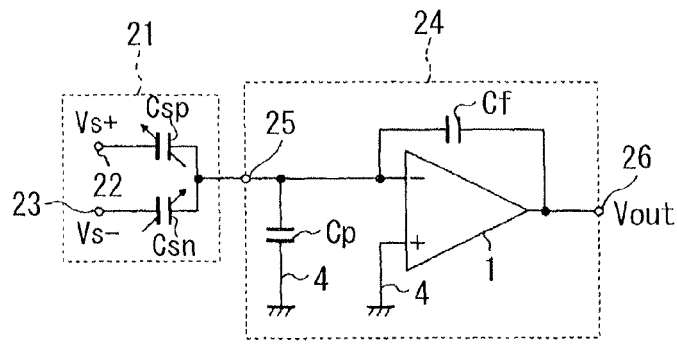
FIG. 2A is an electric circuit diagram of a C-V converter circuit using the amplifier circuit.

When a capacitive sensor of single end output is used, a C-V converter circuit 24 is configured as shown in FIG. 2A. A sensor element 21 of the capacitive sensor includes variable capacitors Csp, Csn. When acceleration is applied, the capacitances of the variable capacitors Csp, Csn complementarily vary according to the applied acceleration. The terminals (fixed electrodes) of the variable capacitors Csp, Csn on one side are respectively connected to terminals 22, 23. To these terminals 22, 23, carrier signals Vs+, Vs− are applied. These carrier signals are rectangular signals having certain amplitude and complementarily vary with respect to each other. The commonly connected other terminal (variable electrode) of the variable capacitors Csp, Csn is connected to the input terminal 25 of a C-V converter circuit 24.

The C-V converter circuit 24 (corresponding to a signal processor circuit) is formed of the amplifier circuit 1 switched to single end output configuration and capacitors Cf, Cp. The inverting input terminal of the amplifier circuit 1 is connected to an input terminal 25. Between the inverting input terminal of the amplifier circuit 1 and the power supply line 4 (ground), a capacitor Cp is connected. The non-inverting input terminal of the amplifier circuit 1 is connected to the power supply line 4. Between the output terminal and the inverting input terminal of the amplifier circuit 1, the capacitor Cf is connected. The output terminal of the amplifier circuit 1 is connected to an output terminal 26. With this configuration, a voltage signal Vout corresponding to the difference in capacitance is outputted from the output terminal 26 of the C-V converter circuit 24 when acceleration is applied and the capacitances of the variable capacitors Csp, Csn of the sensor element 21 are thereby varied.

Figure 2B:
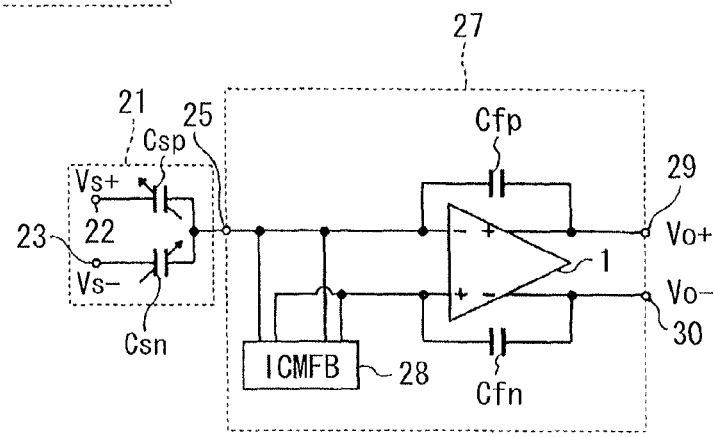
FIG. 2B is an electric circuit diagram of a C-V converter circuit using the amplifier circuit.

When a capacitive sensor of single end output is used, a C-V converter circuit 27 is also configured as shown in FIG. 2B. The C-V converter circuit 27 (corresponding to a signal processor circuit) is formed of the amplifier circuit 1 switched to differential output configuration, capacitors Cfp, Cfn and an input common mode feedback circuit (ICMFB circuit) 28. The inverting input terminal of the amplifier circuit 1 is connected to the input terminal 25. Between the non-inverting output terminal and the inverting input terminal of the amplifier circuit 1, the capacitor Cfp is connected. Between the inverting output terminal and the non-inverting input terminal of the amplifier circuit 1, the capacitor Cfn is connected. The non-inverting output terminal and the inverting output terminal of the amplifier circuit 1 are respectively connected to two output terminals 29, 30.

In the ICMFB circuit 28, the positive and the negative terminals of the amplifier circuit 1 are connected only to a capacitor, the gate of a transistor, or the like. It is used when the impedance is high. The ICMFB circuit 28 holds the common mode level (neutral point potential) of an input signal supplied to each input terminal of the amplifier circuit 1 at a predetermined level. With this configuration, voltage signals Vo+, Vo− corresponding to the difference in capacitances are respectively outputted from the non-inverting output terminal 29 and inverting output terminal 30 of the C-V converter circuit 27 when acceleration is applied and the capacitances of the variable capacitors Csp, Csn of the sensor element 21 are thereby varied.

Figure 2C:
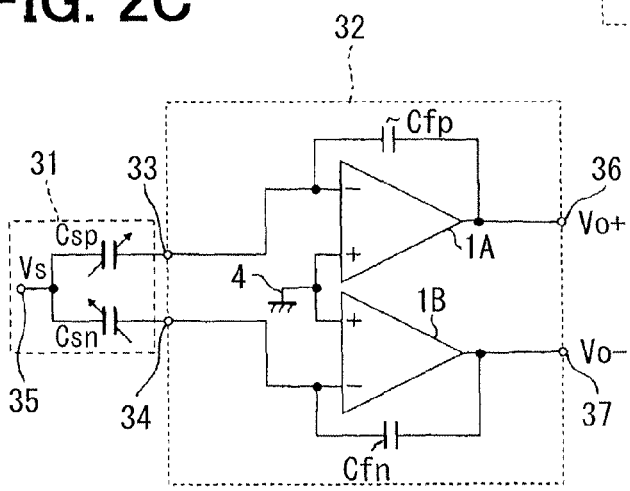
FIG. 2C is an electric circuit diagram of a C-V converter circuit using the amplifier circuit.

When a capacitive sensor of differential output is used, a C-V converter circuit 32 is configured as shown in FIG. 2C. As shown in FIG. 2C, a sensor element 31 of the capacitive sensor includes variable capacitors Csp, Csn. When acceleration is applied, the capacitances of the variable capacitors Csp Csn complementarily vary with respect to each other according to the acceleration. The terminals (fixed electrodes) of the variable capacitors Csp, Csn on one side are respectively connected to input terminals 33, 34 of the C-V converter circuit 32. The commonly connected terminal (variable electrode) of the variable capacitors Csp, Csn on the other side is connected to a terminal 35. To the terminal 35, a carrier signal Vs that is a rectangular signal having certain amplitude is applied.

The C-V converter circuit 32 (corresponding to a signal processor circuit) is formed of two amplifier circuits 1A, 1B switched to single end output configuration and capacitors Cfp, Cfn. The amplifier circuits 1A, 1B are configured similarly to the amplifier circuit 1. The inverting input terminals of the amplifier circuits 1A, 1B are respectively connected to the input terminals 33, 34. The non-inverting input terminals of the amplifier circuits 1A, 1B are commonly connected and connected to the power supply line 4. Between the respective output terminals and inverting input terminals of the amplifier circuits 1A, 1B, the capacitors Cfp, Cfn are respectively connected Output terminals of the amplifier circuits 1A, 1B are respectively connected to a non-inverting output terminal 36 and an inverting output terminal 37 of the C-V converter circuit 32.

With this configuration, voltage signals Vo+, Vo− corresponding to the difference in capacitance are respectively outputted from the non-inverting output terminal 36 and the inverting output terminal of the C-V converter circuit 32 when acceleration is applied and the capacitances of the variable capacitors Csp, Csn of the sensor element 31 are thereby varied.

Figure 2D:
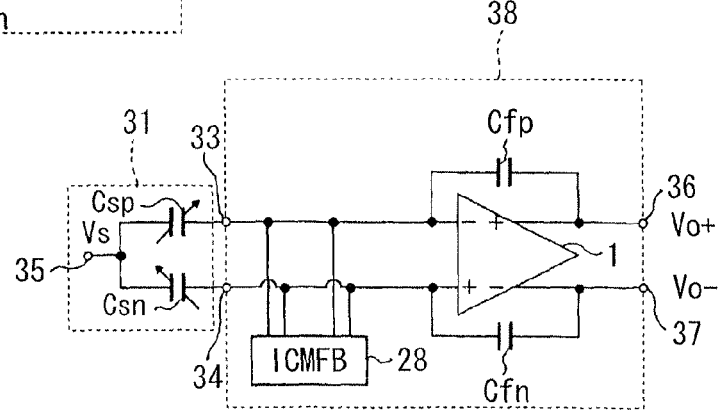
FIG. 2D is an electric circuit diagram of a C-V converter circuit using the amplifier circuit.

When a capacitive sensor of differential output is used, a C-V converter circuit 38 is configured as shown in FIG. 2D. The C-V converter circuit 38 (corresponding to a signal processor circuit) shown in FIG. 2D is formed of the amplifier circuit 1 switched to differential output configuration, capacitors Cfp, Cfn, and the ICMFB circuit 28. The inverting input terminal and non-inverting input terminal of the amplifier circuit 1 are respectively connected to the input terminals 33, 34 of the C-V converter circuit 38.

Between the non-inverting output terminal and the inverting input terminal of the amplifier circuit 1, the capacitor Cfp is connected. Between the inverting output terminal and non-inverting input terminal of the amplifier circuit 1, the capacitor Cfn is connected. With this configuration, voltage signals Vo+, Vo− corresponding to the difference in capacitance are respectively outputted from the non-inverting output terminal 36 and inverting output terminal 37 of the C-V converter circuit 38 when acceleration is applied and the capacitances of the variable capacitors Csp, Csn of the sensor element 31 are thereby varied.

The amplifier circuit 1 with the above configuration is applied to a signal processing IC that carries out predetermined signal processing on the output signal of a capacitive sensor.

Figure 3A:
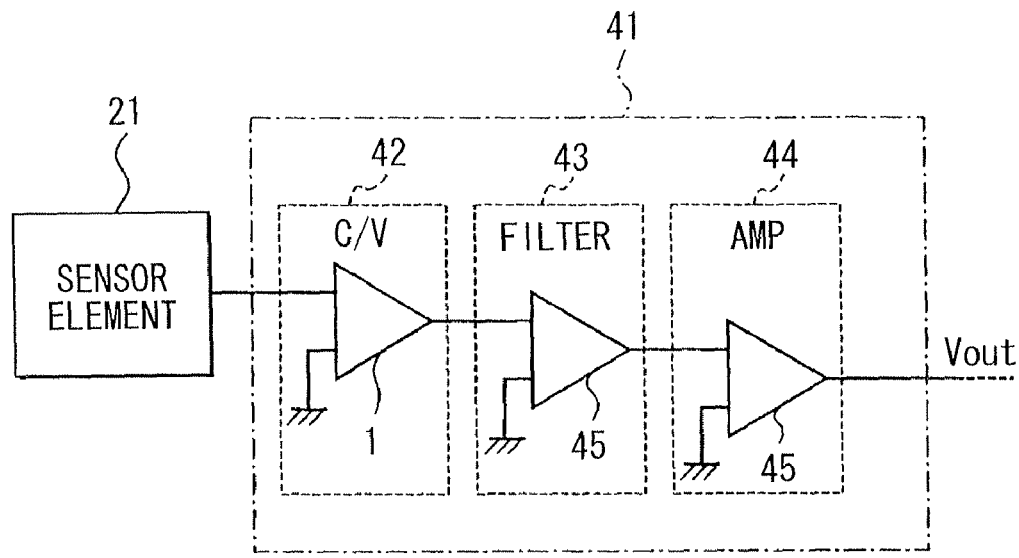
FIG. 3A is a block diagram showing an example of a signal processing IC using the amplifier circuit.
Figure 3B:
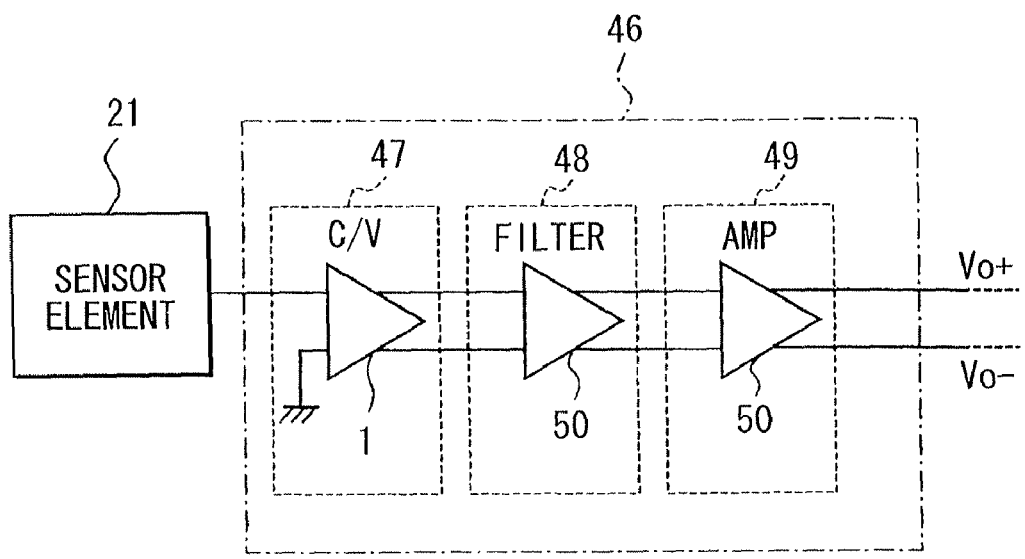
FIG. 3B is a block diagram showing an example of a signal processing IC using the amplifier circuit.

When the signal type required at the stage subsequent to the signal processing IC is single end, the signal processing IC can be configured as shown in FIG. 3A. The sensor element 21 shown in FIGS. 3A and 3B is of single end output type and configured similarly to that shown in FIGS. 2A and 2B. A signal processing IC 41 (corresponding to a semiconductor integrated circuit device) includes a C-V converter section 42, a filter section 43, and an amplifier section 44. The C-V converter section 42 converts the output signal from the sensor element 21 into the voltage signal. The C-V converter section 42 is configured based on the amplifier circuit 1 switched to single end output configuration.

The filter section 43 is a switched capacitor filter and passes through only the low-frequency components of the output signal of the C-V converter section 42. The filter section 43 is configured based on an amplifier circuit 45 with a single end output configuration. The amplifier section 44 amplifies the output signal of the filter section 43 with a predetermined gain and outputs it. The amplifier section 44 is configured based on an amplifier circuit 45 with a single end output configuration. With this configuration, a single-end output signal Vout corresponding to the output signal of the sensor element 21 are outputted from the signal processing IC 41. The amplifier circuit 1 switched to single end output configuration may be used in place of the amplifier circuit 45.

When the signal type required at the stage subsequent to the signal processing IC is differential, the signal processing IC can be configured as shown in FIG. 3B. A signal processing IC 46 (corresponding to a semiconductor integrated circuit device) includes a C-V converter section 47, a filter section 48, and an amplifier section 49. The C-V converter section 47 is configured based on the amplifier circuit 1 switched to differential output configuration. The filter section 48 is configured based on an amplifier circuit 50 with a differential output configuration. The amplifier section 49 is configured based on an amplifier circuit 50 with a differential output configuration. With this configuration, differential output signals Vo+, Vo− corresponding to the output signals of the sensor element 21 are outputted from the signal processing IC 46. The amplifier circuit 1 switched to differential output configuration may be used in place of the amplifier circuit 50.

Figure 4A:
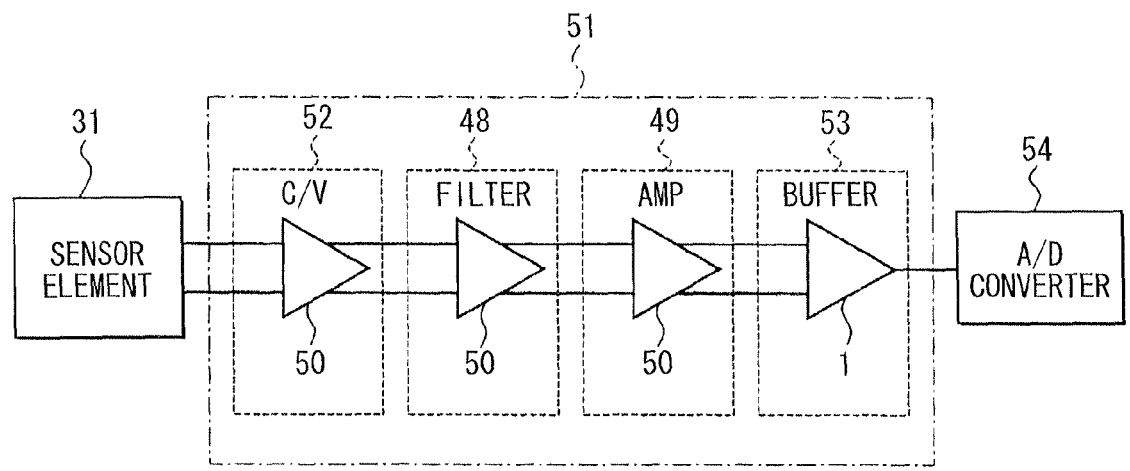
FIG. 4A is a block diagram showing another example of a signal processing IC using the amplifier circuit.
Figure 4B:
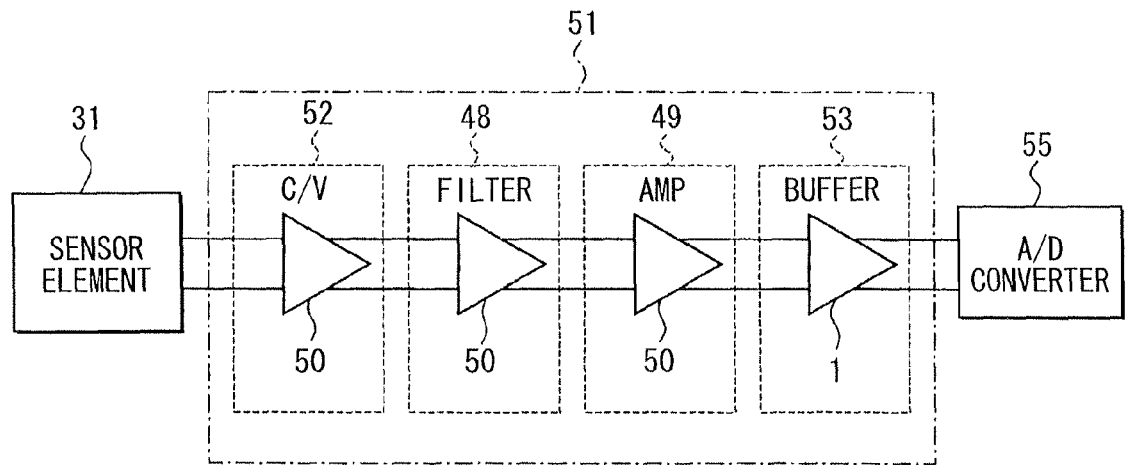
FIG. 4B is a block diagram showing a further example of a signal processing IC using the amplifier circuit.

The amplifier circuit 1 with the above configuration is applied to a signal processing IC that carries out predetermined signal processing different from the above signal processing on the output signals of the capacitive sensor as shown in FIGS. 4A and 4B.

The capacitive sensor has the sensor elements 31 which are of differential output type, and configured similarly to those shown in FIGS. 2C and 2D. The signal processing IC 51 (corresponding to a semiconductor integrated circuit device) includes a C-V converter section 52, the filter section 48, an amplifier section 49, and a buffer amplifier section 53. The C-V converter section 52 converts the output signals from the sensor element 31 into voltage signals. The C-V converter section 52 is configured based on the amplifier circuit 50 with a differential output configuration. The amplifier circuit 1 switched to differential output configuration may be used in place of the amplifier circuit 50. The filter section 48 and the amplifier section 49 are respectively configured similarly to those shown in FIG. 3B. The buffer amplifier section 53 outputs signals obtained by enhancing the output capability of the output signals of amplifier section 49. The buffer amplifier section 53 is configured based on the amplifier circuit 1.

The thus configured signal processing IC 51 can cope with both the following applications as described below: applications in which its output signals are A/D-converted through an A/D converter 54 (Refer to FIG. 4A) of single end input type; and applications in which its output signals are A/D-converted through an A/D converter 55 (Refer to FIG. 4B) of differential input type. When the output signal of the signal processing IC 51 is inputted to the A/D converter 54 of single end input type as shown in FIG. 4A, the amplifier circuit 1 of the buffer amplifier section 53 is switched to single end type. Thus analog signals (voltage) corresponding to the output of the sensor element 31 of differential output type are converted into digital values by the A/D converter 54 of single end input type. When an output signal of the signal processing IC 51 is inputted to the A/D converter 55 of differential input type as shown in FIG. 4B, the amplifier circuit 1 of the buffer amplifier section 53 is switched to differential type. Thus analog signals corresponding to the output of the sensor element 31 of differential output type are converted into digital values by the A/D converter 55 of differential input type.

Figure 5:
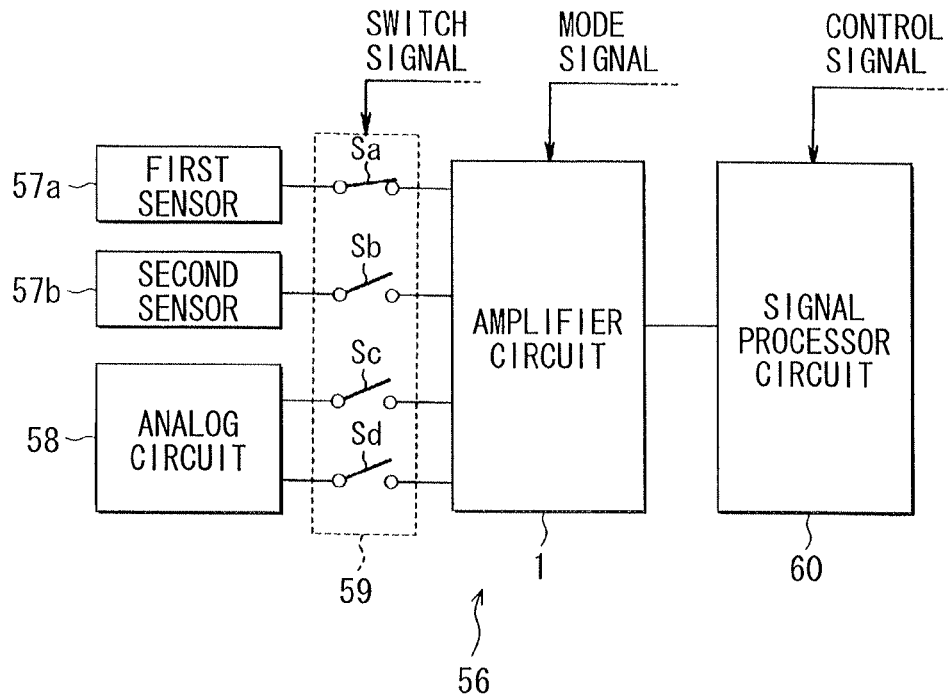
FIG. 5 is a block diagram showing an example of a multi-channel A/D converter using an amplifier circuit.
Figure 6:
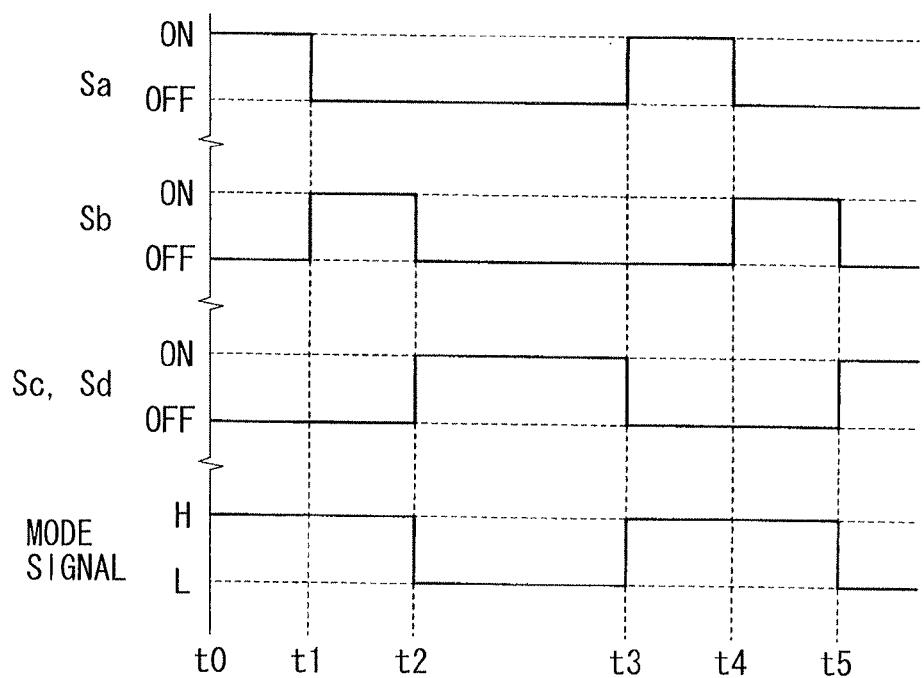
FIG. 6 is a time chart showing the timing of switch setting change and a mode switching signal.

The amplifier circuit 1 with the above configuration is applied to a multi-channel A/D converter as shown in FIG. 5 and FIG. 6.

The multi-channel-type A/D converter, in which multiple input signals are inputted in a time-divided manner and each input signal is A/D-converted using one signal processing system. To the A/D converter 56 (corresponding to a signal processor circuit) shown in FIG. 5, the output signal (voltage) of a first sensor 57a, the output signal (voltage) of a second sensor 57b, and the output signals (voltage) of an analog circuit 58 are inputted. The first sensor 57a and the second sensor 57b are of single Fend output type. The analog circuit 58 is of differential output type.

A multiplexer 59 includes switches Sa, Sb, Sc, Sd. The respective output signals of the first sensor 57a and the second sensor 57b are respectively supplied to input terminals of the switches Sa, Sb of the multiplexer 59 on one side. The output signals of the analog circuit 58 are supplied to input terminals of the switches Sc, Sd of the multiplexer 59 on one side. Output terminals of the switches Sa to Sd on the other side are all connected to the amplifier circuit 1. The multiplexer 59 switches turn-on and -off of the switches Sa to Sd in a time-divided manner and thereby supplies only one of the above respective output signals to the subsequent amplifier circuit 1. Switching of each switch Sa to Sd is controlled according to a switch switching signal supplied from a control section not shown.

The amplifier circuit 1 is supplied with a mode switching signal from a control section, not shown. The amplifier circuit 1 is configured as described above. That is, when the mode switching signal is at the high level (H level), it is set in the single end output configuration; and when the mode switching signal is at the low level (L level), it is set in the differential output configuration. The amplifier circuit 1 has its output configuration switched to switching of each of the above signal supplied through the multiplexer 59.

Switching of the switches Sa to Sd and the mode switching signal are shown in FIG. 6. During a period from time t0 to time t1, only the switch Sa is ON (on-state) and the switches Sb to Sd are OFF (off-state). The amplifier circuit 1 is supplied with the mode switching signal of the H level. As a result, only the output signal of the first sensor 57a of single end output type is inputted to the amplifier circuit 1 with a single end output configuration. During a period from time t1 to time t2, only the switch Sb is ON and the other switches Sa, Sc, Sd are OFF. The amplifier circuit 1 is supplied with the mode switching signal of the H level. As a result, the output signal of the second sensor 57b of single end output type is inputted to the amplifier circuit 1 with a single end output configuration.

During a period from time t2 to time t3, both of the switches Sc, Sd are ON and both of the switches Sa, Sb are OFF. The amplifier circuit 1 is supplied with the mode switching signal of the L level. As a result, output signals of the analog circuit 58 of differential output type are inputted to the amplifier circuit 1 with a differential output configuration. Also during a period after time t3, the setting of the switches Sa to Sd is switched similarly as during the period from time t0 to time t3. Then the respective output signals of the first sensor 57a, second sensor 57b, and analog circuit 58 are inputted to the amplifier circuit 1 in a time-divided manner. The output configuration of the amplifier circuit 1 is also switched in a time-divided manner. As described above, the amplifier circuit 1 has its output configuration switched in a time-divided manner according to the type of a supplied signal (each output signal).

The amplifier circuit 1 amplifies supplied signals with a predetermined gain and outputs them. The output signal of the amplifier circuit 1 is supplied to a signal processor section 60. The signal processor circuit 60 sequentially A/D-converts the supplied signal, which is the output signal of the amplifier circuit 1, according to control signals given from the control section, not shown. With this configuration, three signals outputted from the first sensor 57a, second sensor 57b, and analog circuit 58 are amplified in a time-divided manner using one amplifier circuit 1; and further they are A/D-converted in a time-divided manner using one signal processor circuit 60.

Figure 7A:
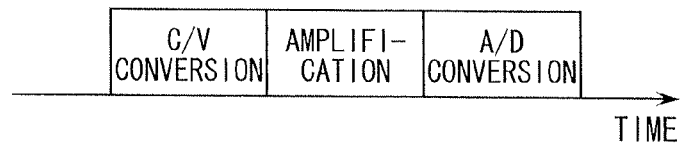
FIG. 7A is a time chart showing a sequence of operations.
Figure 7B:
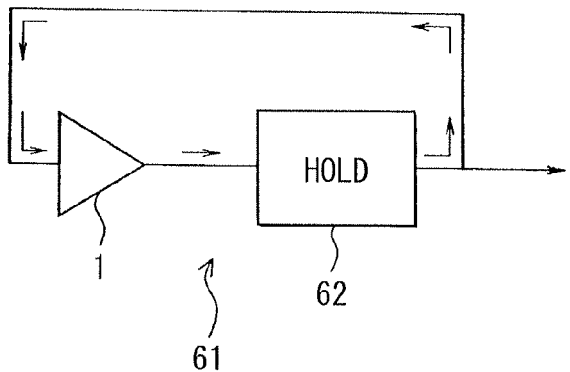
FIG. 7B is an electric circuit diagram schematically showing a cyclic signal processor circuit using the amplifier circuit.

The signal processor circuit 60 may be configured to share the amplifier circuit 1 with the above configuration and carry out signal processing using a cyclic algorithm as shown in FIGS. 7A and 7B.

In the signal processor circuit 61 using a cyclic algorithm, each function is carried out by taking the following measure: the mode of the circuit configured based on the amplifier circuit 1 is switched in a time-divided manner; and signals are cycled through the amplifier circuit 1 and a holding circuit 62 that temporarily holds (samples and holds) the output thereof.

The signal processor circuit 61 shown in FIG. 7B carries out, for example C-V conversion operation to convert an output signal from a sensor of single end output type into a voltage signal; thereafter, amplification operation to amplify this voltage signal; and then A/D conversion operation to convert the amplified voltage signal into a digital value. Though not shown in the drawing, the signal processor circuit 60 includes multiple capacitors, multiple switches, and the like in addition to the amplifier circuit 1. The signal processor circuit 61 implements each the above function (each operation) by changing the switching state of each switch.

When each operation described above is carried out, the amplifier circuit 1 is switched as described below. It is switched to single end output configuration first and the C-V conversion operation is carried out. When the subsequent amplification operation is started, the amplifier circuit 1 is switched to differential output configuration and the amplification operation and the A/D conversion operation are carried out. That is, the amplifier circuit 1 has its output method changed in process of signal processing.

The signal processor circuit 61 operates as described below with reference to FIG. 8 to FIG. 12.

Figure 8:
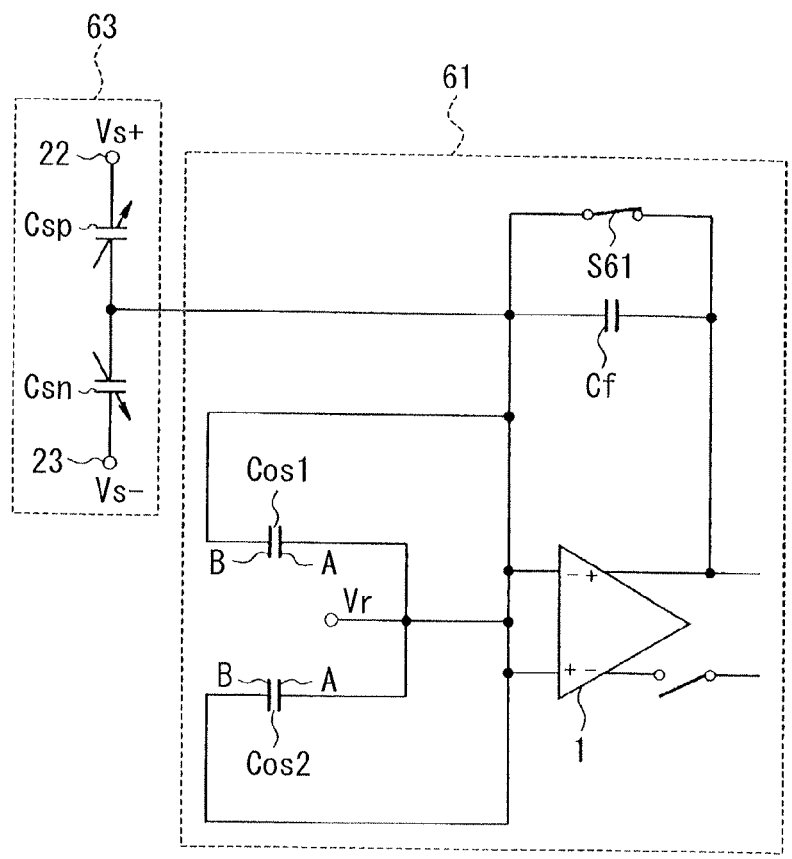
FIG. 8 is an electric circuit diagram showing the circuit mode of a signal processor circuit in reset operation.

First, reset operation is carried out prior to the C-V conversion operation (reset). FIG. 8 schematically illustrates the state of the signal processor circuit 61 in this reset operation. As shown in FIG. 8, the amplifier circuit 1 has been switched to single end output configuration. The commonly connected terminal (movable electrode) of the variable capacitors Csp, Csn of a sensor element 63 of single end output type is connected to the inverting input terminal of the amplification terminal 1. This sensor element 63 is configured similarly to the sensor elements 21 shown in FIGS. 2A and 2B.

Between the output terminal and inverting input terminal of the amplifier circuit 1, the capacitor Cf for feedback is connected. However, both ends of the capacitor Cf are short-circuited through a switch S61. The inverting input terminal and the non-inverting input terminal of the amplifier circuit 1 are supplied with reference voltage Vr (for example, 0V). Both the respective terminals A, B of capacitors Cos1, Cos2 for sampling are short-circuited and they are supplied with the reference voltage Vr. With this configuration, the electric charges in the capacitors Cf, Cos1, Cos2 are initialized in reset operation. Further, an initial bias is applied to the variable capacitors Csp, Csn of the sensor section 63.

Figure 9:
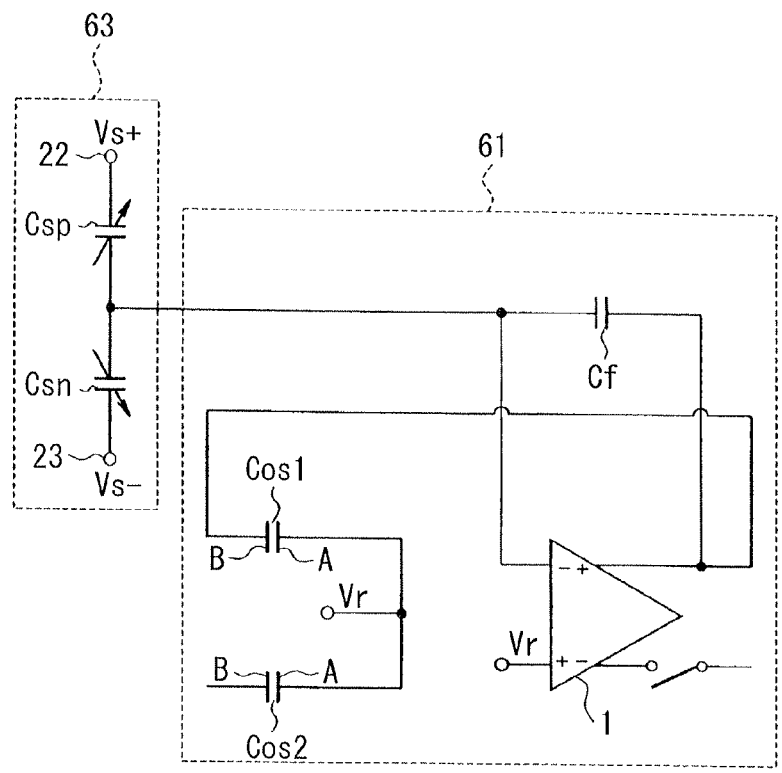
FIG. 9 is an electric circuit diagram showing the circuit mode of a signal processor circuit in first C-V conversion operation.

Following the reset operation, a first C-V conversion operation is carried out (C/V(1)). FIG. 9 schematically illustrates the state of the signal processor circuit 60 in the first C-V conversion operation. As shown in FIG. 9, the amplifier circuit remains in a single end output configuration. The non-inverting input terminal of the amplifier circuit 1 is supplied with the reference voltage Vr. Short-circuiting between both ends of the capacitor Cf connected between the output terminal and inverting input terminal of the amplifier circuit 1 is canceled. The respective terminals A of the capacitors Cos1, Cos2 are supplied with the reference voltage Vr. The terminal B of the capacitor Cos1 is connected to the output terminal of the amplifier circuit 1. The terminal B of the capacitor Cos2 is open (unconnected).

An output signal corresponding to acceleration has not been outputted yet from the sensor section 63 to the signal processor circuit 60 with this configuration. In the first C-V conversion operation, for this reason, electric charges corresponding only to unwanted components (1/f noise, offset noise, and the like) produced during C-V conversion are stored in the capacitor Cos1. The output voltage Vout[C/V(1)] of the amplifier circuit 1 at this time is expressed by Expression (1) below. However, the voltage corresponding to the unwanted components is represented by V of.

$$Vout[C/V(1)] = Vof \quad (1)$$

Figure 10:
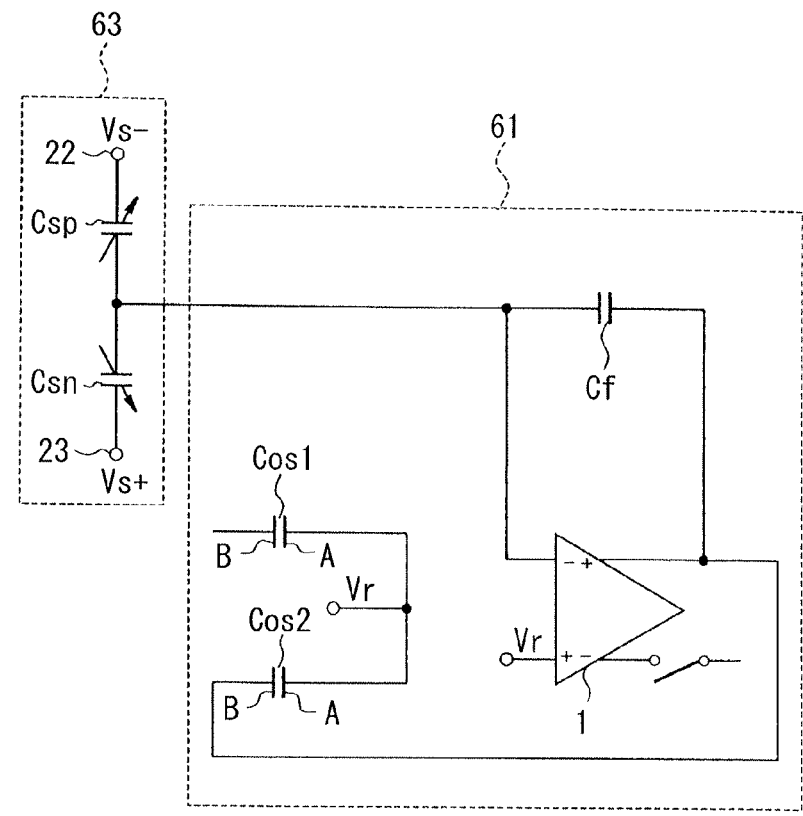
FIG. 10 is an electric circuit diagram showing the circuit mode of a signal processor circuit in second C-V conversion operation.

Following the first C-V conversion operation, second C-V conversion operation is carried out (C/V(2)). The carrier wave applied to a sensor section 63 during this period is opposite in polarity to the carrier wave during the periods of the reset operation and the first C-V conversion operation. FIG. 10 illustrates the state of the signal processor circuit 61 in the second C-V conversion operation. As shown in FIG. 10, the amplifier circuit 1 remains in a single end output configuration. The terminal B of the capacitor Cos1 is open (unconnected). The terminal 13 of the capacitor Cos2 is connected to the output terminal of the amplifier circuit 1.

An output signal corresponding to acceleration is outputted from the sensor section 63 to the signal processor circuit 60 with this configuration. In the second C-V conversion operation, for this reason, electric charges corresponding to the signal component corresponding to the acceleration are stored in the capacitor Cos2 in addition to those corresponding to the unwanted components produced during C-V conversion. The output voltage Vout[C/V(2)] of the amplifier circuit 1 at this time is expressed by Expression (2) below. However, the capacitance of the capacitor Cf is represented by Cf, the capacitance of the variable capacitors Csp, Csn is represented by ΔCs, and the voltage difference between carrier signals Vs+, Vs− is represented by ΔVs.

$$Vout[C/V(2)] = Vof - (1/Cf)(\Delta Cs \times \Delta Vs) \quad (2)$$

Following the second C-V conversion operation, switching operation is carried out. In this switching operation, the configuration of the amplifier circuit 1 is switched from single end output configuration to differential output configuration. At this time, the electric charges in the capacitors Cos1, Cos2 remains held there.

Figure 11:
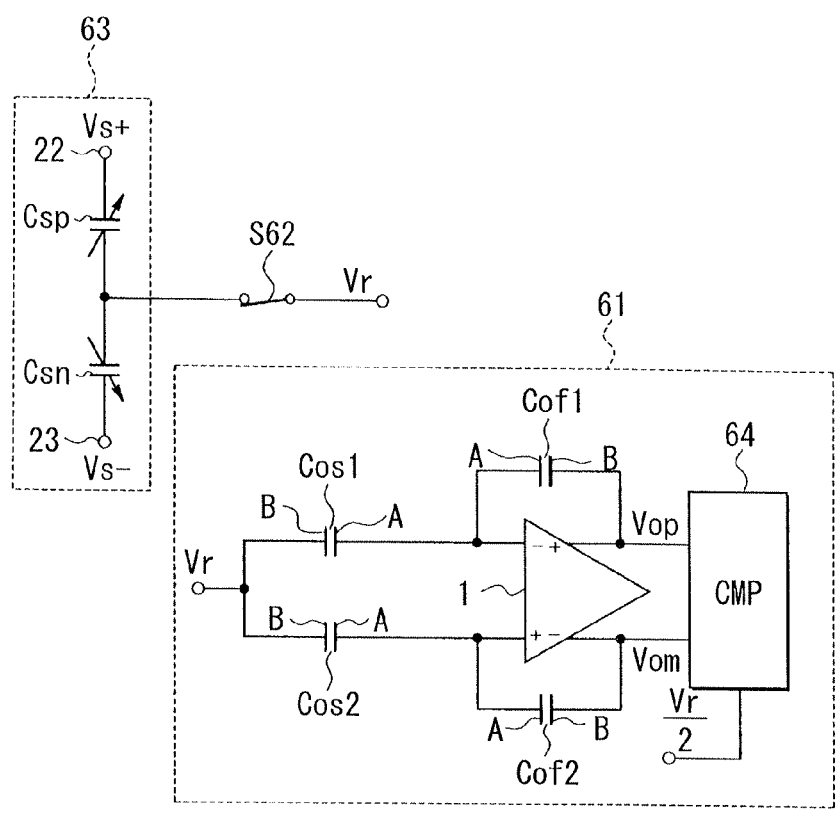
FIG. 11 is an electric circuit diagram showing the circuit mode of a signal processor circuit in CDS operation or amplification operation.

Following the switching operation, CDS (Double Correlated Sampling) operation is carried out (CDS). FIG. 11 schematically illustrates the state of the signal processor circuit 61 in the CDS operation. The C-V conversion operation shown in FIG. 7 includes up to this CDS operation. As shown in FIG. 11, the amplifier circuit 1 has been switched to differential output configuration. The commonly connected terminal of the variable capacitors Csp, Csn of the sensor section 63 is connected to a supply terminal for reference voltage Vr through a switch S62. Thus the sensor section 63 and the signal processor circuit 61 are disconnected from each other.

Between the non-inverting output terminal and inverting input terminal of the amplifier circuit 1, a capacitor Cof1 for feedback whose electric charges have been initialized beforehand is connected. Between the inverting output terminal and non-inverting input terminal of the amplifier circuit 1, a capacitor Cof2 for feedback whose electric charges have been initialized beforehand is connected. The terminals B of the capacitors Cos1, Cos2 are commonly connected and supplied with the reference voltage Vr. The terminals A of the capacitors Cos1, Cos2 are respectively connected to the inverting input terminal and non-inverting input terminal of the amplifier circuit 1.

The output voltages Vop Vom respectively outputted from the non-inverting output terminal and the inverting output terminal of the amplifier circuit 1 are supplied to a variable gain comparator 64. The variable gain comparator 64 compares the difference (Vop-Vom) between the inputted voltages with a threshold voltage (for example, voltage Vr/2 equal to ½ of the reference voltage Vr).

With this configuration, the electric charges in the capacitors Cos1, Cos2 are respectively transferred to the capacitor Cof1, Cof2. The difference Vout[CDS] between the output voltages Vop, Vom of the amplifier circuit 1 at this time is expressed by Expression (3) below.

$$Vout[CDS] = Vout[C/V(1)] - Vout[C/V(2)] \quad (3)$$
$$= (1/Cf)(\Delta Cs \times \Delta Vs)$$

Noise produced during the C-V conversion is removed by taking the difference between the electric charges stored (sampled) in the capacitors Cos1, Cos2 in the CDS operation as described above. Therefore, S/N is enhanced.

Figure 12:
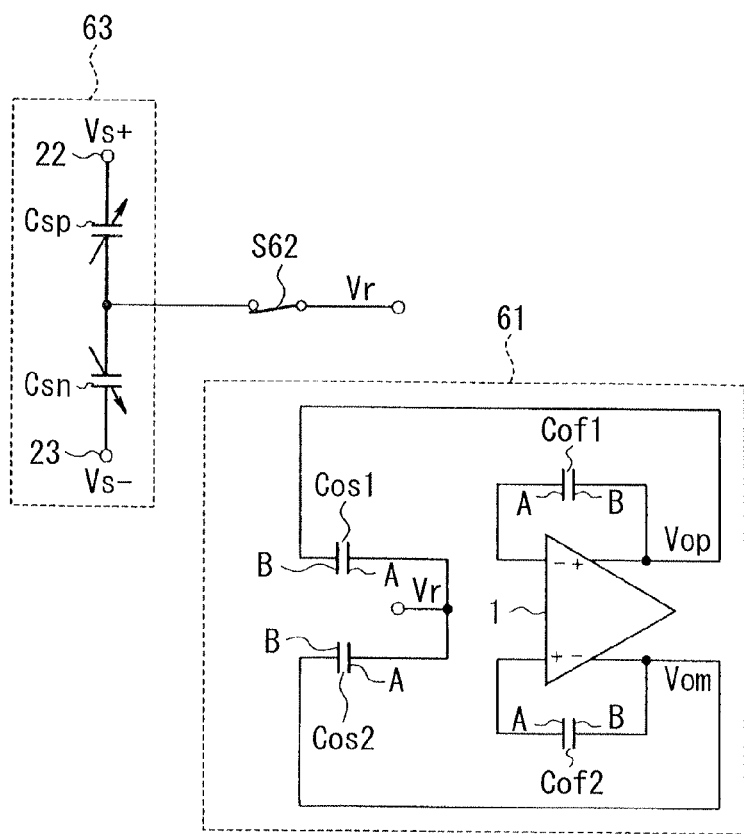
FIG. 12 is an electric circuit diagram showing how an output result is cycled in CDS operation or amplification operation.

When it is concluded from the variable gain comparator 64 that the difference between the voltages is greater in this CDS operation amplification operation is not carried out and the A/D conversion operation is carried out next. Meanwhile, when it is concluded that the difference between the voltages is less, the amplification operation is carried out. In cases where the flow proceeds to amplification operation, the state of the signal processor circuit 61 is switched as shown in FIG. 12 in the latter half of the CDS operation. As shown in FIG. 12, the terminals A of the capacitors Cos1, Cos2 are commonly connected and supplied with the reference voltage Vr. The terminals B of the capacitors Cos1, Cos2 are respectively connected to the non-inverting output terminal and inverting output terminal of the amplifier circuit 1. Though not shown in the drawing the variable gain comparator 64 is disconnected from the amplifier circuit 1.

With this configuration, the electric charges in the capacitors Cos1, Cos2 are set by the respective output voltages Vop, Vom of the amplifier circuit 1. That is, the electric charges in the capacitors Cof1, Cof2 are respectively copied to the capacitors Cos1, Cos2. That is, the output result of the amplifier circuit 1 is cycled. The difference Vout[CDS] between the output voltages Vop, Vom of the amplifier circuit 1 at this time is expressed by Expression (3) above.

Following the CDS operation, the amplification operation is carried out (amplification). When this amplification operation is started, the signal processor circuit 61 is switched to the same state as shown in FIG. 11. As a result, the electric charges in the capacitors Cos1, Cos1 are respectively transferred to the capacitors Cof1, Cof2. The difference Vout [Amp1] between the output voltages Vop, Vom of the amplifier circuit 1 at this time is expressed by Expression (4) below.

$$Vout[Amp1]=2\times Vout[CDS] \quad (4)$$

That is, the difference Vout[Amp1] between the output voltages at this time is equal to a value obtained by amplifying the difference Vout[CDS] between the output voltages in the CDS operation to double. When it is concluded at the variable gain comparator 64 that the difference between the voltages is greater than the threshold voltage, the amplification operation is terminated and then the A/D conversion operation is carried out. Meanwhile, when it is concluded that the difference between the voltages is less than the threshold voltage, the signal processor circuit 60 is switched to the state shown in FIG. 12. The output result of the amplifier circuit 1 is cycled and then amplification operation is carried out again. The difference Vout[Amp2] between the respective output voltages Vop, Vom of the amplifier circuit 1 in this case is expressed by Expression (5) below.

$$Vout[Amp2]=2\times Vout[Amp1]=4\times Vout[CDS] \quad (5)$$

In this embodiment, the amplification operation is carried out until the difference between the output voltages Vop, Vom of the amplifier circuit 1 becomes greater than the threshold voltage (auto gain). The amplification operation may be carried out by amplifying output voltage obtained after the C-V conversion operation to the Nth power of 2 (fixed gain). N is an arbitrary integer and is equivalent to the number of times, by which amplification operation is carried out.

In the subsequent A/D conversion operation, the circuit mode of the signal processor circuit 60 is switched so as to implement a cyclic A/D converter using the amplifier circuit 1 with a differential output configuration. The operation and the like of this cyclic A/D converter are conventional as described in detail in, for example, JP 2008-104142A and the like. During the A/D conversion operation, the output voltage of the amplifier circuit 1 is dynamically varied according to the output of a comparator (not shown) for A/D conversion. As the result of the A/D conversion operation carried out as described above, for example, an 11-bit digital value is outputted. When the A/D conversion operation is terminated, the reset operation is carried out again. At this time, the amplifier circuit 1 is switched from the differential output configuration to the single end output configuration.

According to this embodiment, the following advantages are obtained.

In the amplifier circuit 1, one of the single end output configuration and the differential output configuration can be selected. The amplifier circuit 1 can be caused to function in that configuration by changing the switching state of the switches S1, S2, S4 according to the level of an externally supplied mode switching signal. Therefore, the amplifier circuit 1 can be applied regardless of the type (single end type, differential type) of a signal (input signal) supplied from the circuit at the preceding stage or a signal (output signal) required for the circuit at the subsequent stage. Since the amplifier circuit 1 can cope with various signal types as described above its versatility can be enhanced without increasing the circuit area.

Since the versatility of the amplifier circuit 1 can be enhanced as described above, use of the amplifier circuit 1 makes it possible to configure a signal processor circuit that carries out various types of signal processing regardless of the types of input signals or output signals. That is, just one amplifier circuit 1 can cope with various types of signal processing different in input/output signal type. For example, with respect to C-V converter circuits used to convert the output of a capacitive sensor into voltage, there are various circuit modes depending on the output methods of the sensors. Use of the amplifier circuit 1 in this embodiment makes it possible to easily implement these various C-V converter circuits.

To A/D-convert the analog output of a signal processor circuit, it is conventionally necessary to change the configuration of the output stage of the signal processor circuit according to the input method of an A/D converter. In general, many A/D converters incorporated into a microcomputer are of single end input type and many discrete A/D converters are of differential input type. Even in this case, A/D converters of various input types can be accommodated just by changing the switch 51, S2, S4 setting without changing the configuration of the output stage by using the amplifier circuit 1 in this embodiment to configure a signal processor circuit.

The A/D converter 56 using the amplifier circuit 1 amplifies multiple externally supplied signals using one amplifier circuit 1 in a time-divided manner. Further, it A/D-converts them using one signal processor section 60 in a time-divided manner. That is, the A/D converter 56 is a multi-channel-type A/D converter in which multiple input signals are inputted in a time-divided manner and each input signal is A/D-converted using one signal processing system. In this case, the configuration of the amplifier circuit 1 (single end output configuration, differential output configuration) can be switched in a time-divided manner by dynamically switching the level of a mode switching signal in process of a series of signal processing in which individual output signals are sequentially amplified and A/D-converted. For this reason amplification and A/D conversion can be sequentially carried out regardless of the types (single end type, differential type) of multiple externally supplied signals.

Use of the amplifier circuit 1 makes it possible to configure the signal processor circuit 61 that carries out predetermined signal processing using a cyclic algorithm. In this case, the configuration of the amplifier circuit 1 can be switched to the single end output configuration or the differential output configuration by appropriately changing the level of the mode switching signal in process of signal processing. For this reason, signal processing can be carried out using one amplifier circuit 1 even when it is necessary to switch the signal type from single end to differential or from differential to single end in process of processing. An example of such cases is A/D conversion processing using a cyclic algorithm.

When the signal processor circuit configured by using the amplifier circuit 1 is integrated as described above, a semiconductor integrated circuit device (IC) accommodating to various signal types can be configured without increasing its circuit area. For example, an amplifier in which the signal type can be dynamically changed can be implemented by using the amplifier circuit 1 to configure an IC module in which the functions of an analog circuit are programmable. Use of such a programmable IC module enables shortening of IC development periods and reduction of total costs.

The switches S1 to S5 additionally provided to switch the circuit mode of the amplifier circuit 1 are formed of analog switches with a CMOS configuration. Such analog switches require a relatively small circuit area. With the configuration of this embodiment, therefore, it is possible to significantly suppress increase in the circuit area of the entire amplifier circuit 1 arising from the additionally provided configuration to switch the circuit mode. Both in the single end output configuration and in the differential output configuration, the switch S3 is OFF and the switch S5 is ON. That is, the switches S3, S5 are provided as dummy switches that do not have a function of switching the circuit mode. Provision of such dummy switches makes each paired configuration symmetrical in structure. For this reason, it is possible to reduce unbalance between pairs due to the parasitic resistance and parasitic capacitance of the switches S1 to S5.

Second Embodiment

Figure 13:
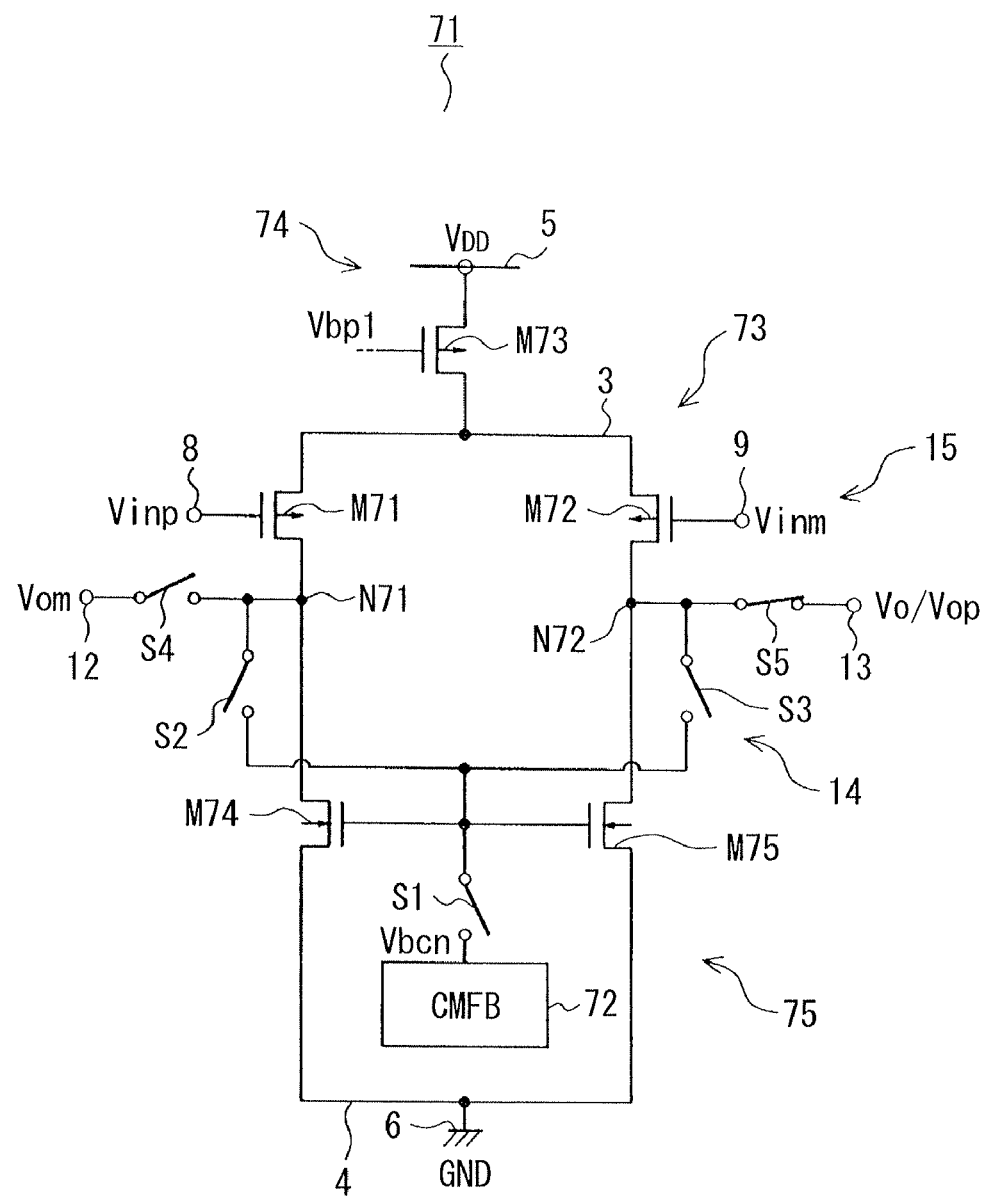
FIG. 13 is an electric circuit diagram showing an amplifier circuit according to a second embodiment of the invention.

A second embodiment of the present invention is shown in FIG. 13, which is equivalent to FIG. 1 referred to in relation to the first embodiment. The same elements as in the first embodiment will be indicated with the same reference numerals and the description thereof will be omitted.

An amplifier circuit 71 shown in FIG. 13 is different from the amplifier circuit 1 shown in FIG. 1 in that MOS transistors M71 to M75 are provided in place of the transistors M1 to M5 and a CMFB circuit 72 is provided in place of the CMFB circuit 2.

The p-channel MOS transistors M71, M72 (corresponding to differential input transistors) form a differential pair 73. Between the commonly connected source of the transistors M71, M72 and the power supply line 3, the p-channel MOS transistor M73 is connected. The gates of the transistors M71, M72 are respectively connected to the input terminals 8, 9. To the gate of the transistor M73, appropriate (optimum) bias voltage Vbp1 is applied. Thus the transistor M73 functions as a current supply circuit 74 that supplies a certain current to the differential pair 73. Between the drains of the transistors M71, M72 and the power supply line 4, the n-channel MOS transistors M74, M75 are respectively connected. The transistors M74, M75 (corresponding to load transistors) form a load circuit 75 together with the CMFB circuit 72. This load circuit 75 is switchable between a first state in which it operates as an active load on the differential pair 73 and a second state in which it functions as a load on the differential pair 73.

The output terminal of the CMFB circuit 72 is connected to the commonly connected gate of the transistors M74, M75 through the switch S1. Between the gate and the drain of the transistor M74, the switch S2 is connected. Between the gate and the drain of the transistor M75, the switch S3 is connected. A common connection node N71 between the transistors M71, M74 is connected to the output terminal 12 through the switch S4. The common connection node N72 between the transistors M72, M75 is connected to the output terminal 13 through the switch S5.

The CMFB circuit 72 (corresponding to a potential applying circuit and in-phase feedback circuit) has the same configuration as that of the CMFB circuit 2 shown in FIG. 1. The CMFB circuit 72 detects the common mode level of balanced signals Vom, Vop outputted from the output terminals 12, 13. Then it controls outputted bias voltage Vbcn (corresponding to predetermined potential) so as to match the resulting detection value with a predetermined value.

The thus configured amplifier circuit 71 functions as an amplifier circuit with the single end configuration when an externally supplied mode switching signal is at the H level. When a mode switching signal of the H level is supplied the transistors M74, M75 form a current mirror circuit. As a result, the load circuit 75 functions as an active load on the transistors M71, M72. Consequently the amplifier circuit 71 is provided with the single end output configuration similarly to the amplifier circuit 1 shown in FIG. 1. Meanwhile, when a mode switching signal of the L level is supplied, the predetermined bias voltage Vbcn is supplied from the CMFB circuit 72 to the commonly connected gate of the transistors M74, M75. Then the load circuit 75 functions as a load on the transistors M71, M72. As a result, the amplifier circuit 71 is provided with a differential output configuration similarly to the amplifier circuit 1 shown in FIG. 1.

With this configuration, the amplifier circuit 71 can be operated with a configuration selected from the single end output configuration and the differential output configuration similarly to the amplifier circuit 1 shown in FIG. 1 by changing the switching states of the switches S1, S2, S4 according to the level of an externally supplied mode switching signal. Therefore, the same operation and advantages as in the first embodiment can be obtained even in the amplifier circuit 71, in which the differential pair 73 is formed of the p-channel MOS transistors M71, M72 and the conductivity type of the other MOS transistors is changed as in this embodiment.

Third Embodiment

Figure 14:
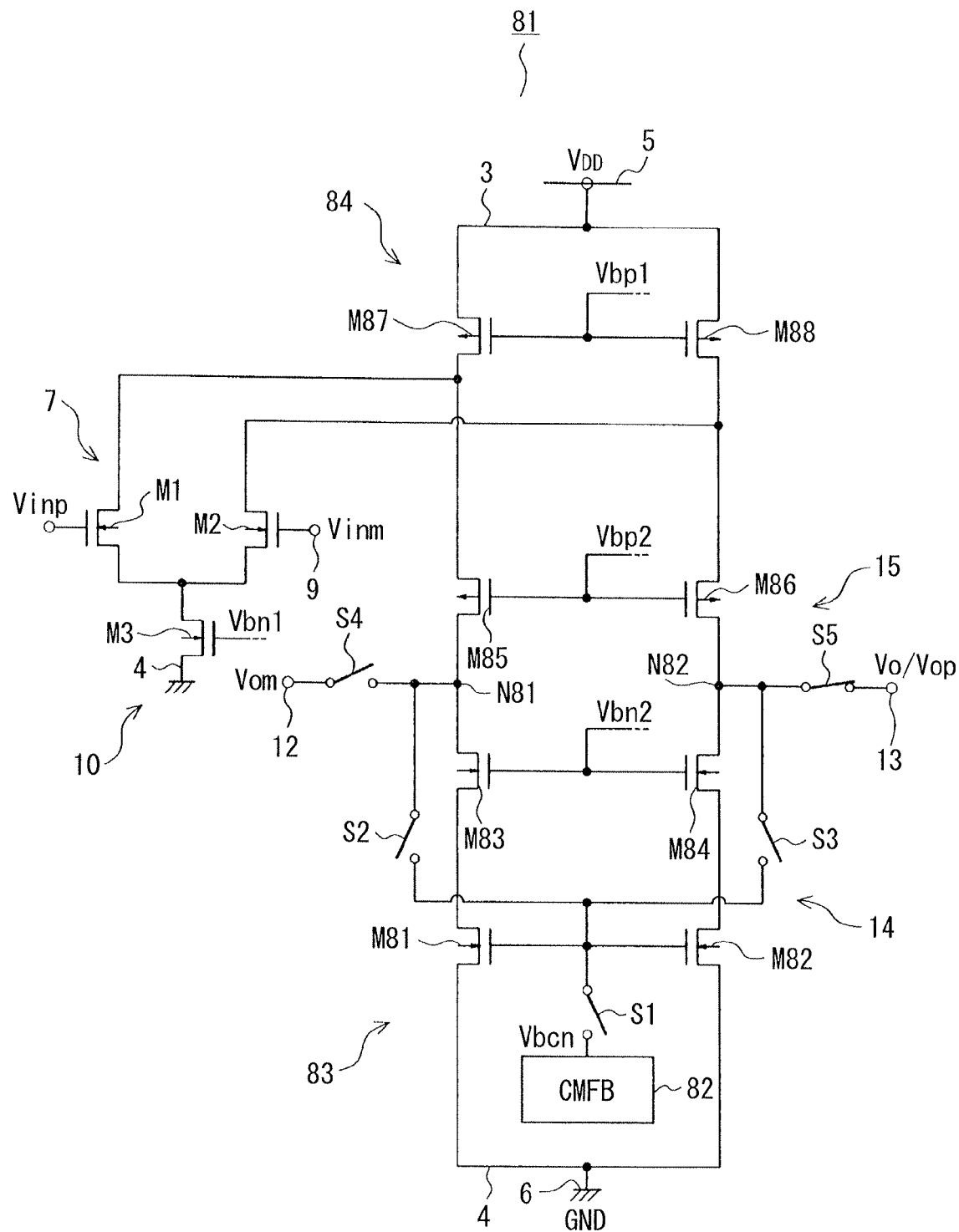
FIG. 14 is an electric circuit diagram showing an amplifier circuit according to a third embodiment of the invention.

A third embodiment of the present invention is shown in FIG. 14, which is equivalent to FIG. 1 referred to in relation to the first embodiment. The same elements as in the first embodiment will be marked with the same reference numerals and the description thereof will be omitted.

An amplifier circuit 81 shown in FIG. 14 is provided by changing the mode of the amplifier circuit 1 shown in FIG. 1 to folded cascode connection. The amplifier circuit 81 is different from the amplifier circuit 1 shown in FIG. 1 in that MOS transistors M81 to M88 are provided in place of the MOS transistors M4, M5 and a CMFB circuit 82 is provided in place of the CMFB circuit 2.

Between the power supply lines 3, 4, the following pairs of transistors are connected in series; n-channel transistors M81 and M82; n-channel transistors M83 and M84; p-channel transistors M85 and M86; and p-channel transistors M87 and M88. These transistors 81 to 88 are vertically stacked. Of these transistors, the transistors M81 to M84 are cascode connected. The transistors M81 to M84 form a load circuit 83 together with the CMFB circuit 82. The load circuit 83 can be switched between a first state in which it operates as an active load on the differential pair 7 and a second state in which it functions as a load on the differential pair 7.

The transistors M87 and M88 form a constant-current circuit 84 for folding back the output current of the differential pair 7 and inputting it to the load circuit 83. To the commonly connected gate of the transistors M87, M88 appropriate bias voltage Vbp1 is supplied. The transistors M85 M86 connected between the load circuit 83 and the constant-current circuit 84 are for suppressing the occurrence of mirror effect at the transistors M1, M2. The sources of these transistors M85, M86 (that is, the drains of the transistors M87, M88) are respectively connected to the drains of the transistors M1, M2. To the commonly connected gate of the transistors M85, M86, appropriate bias voltage Vbp2 is supplied.

The output terminal of the CMFB circuit 82 is connected to the commonly connected gate of the transistors M81, M82 through the switch S1. Between the gate of the transistor M81 and the drain of the transistor M83, the switch S2 is connected. Between the gate of the transistor M82 and the drain of the transistor M84, the switch S3 is connected. A common connection node N81 between the transistor M83 and the transistor M85 is connected to an output terminal 12 through the switch S4. The common connection node N82 between the transistor M84 and the transistor M86 is connected to an output terminal 13 through the switch S5. The nodes N81, N82 are equivalent to the common connection nodes between the differential pair 7 and the load circuit 83.

The CMFB circuit 82 (corresponding to potential applying circuit and in-phase feedback circuit) has the same configuration as that of the CMFB circuit 2 shown in FIG. 1. The CMFB circuit 82 detects the common mode level of balanced signals Vom, Vop outputted from the output terminals 12, 13. Then it controls outputted bias voltage Vbcn (corresponding to predetermined potential) so as to match the resulting detection value with a predetermined value.

With this configuration, the amplifier circuit 81 can be operated with a configuration selected from single end output configuration and differential output configuration similarly to the amplifier circuit 1 shown in FIG. 1 by changing the switching state of the switches S1, S2, S4 according to the level of an externally supplied mode switching signal. Therefore, the same operation and advantage as in the first embodiment can be obtained even in the amplifier circuit 81 with folded cascode connection in this embodiment. In addition, adoption of the mode of cascode connection also brings about the effect of enhanced gain in the amplifier circuit 81.

Fourth Embodiment

Figure 15:
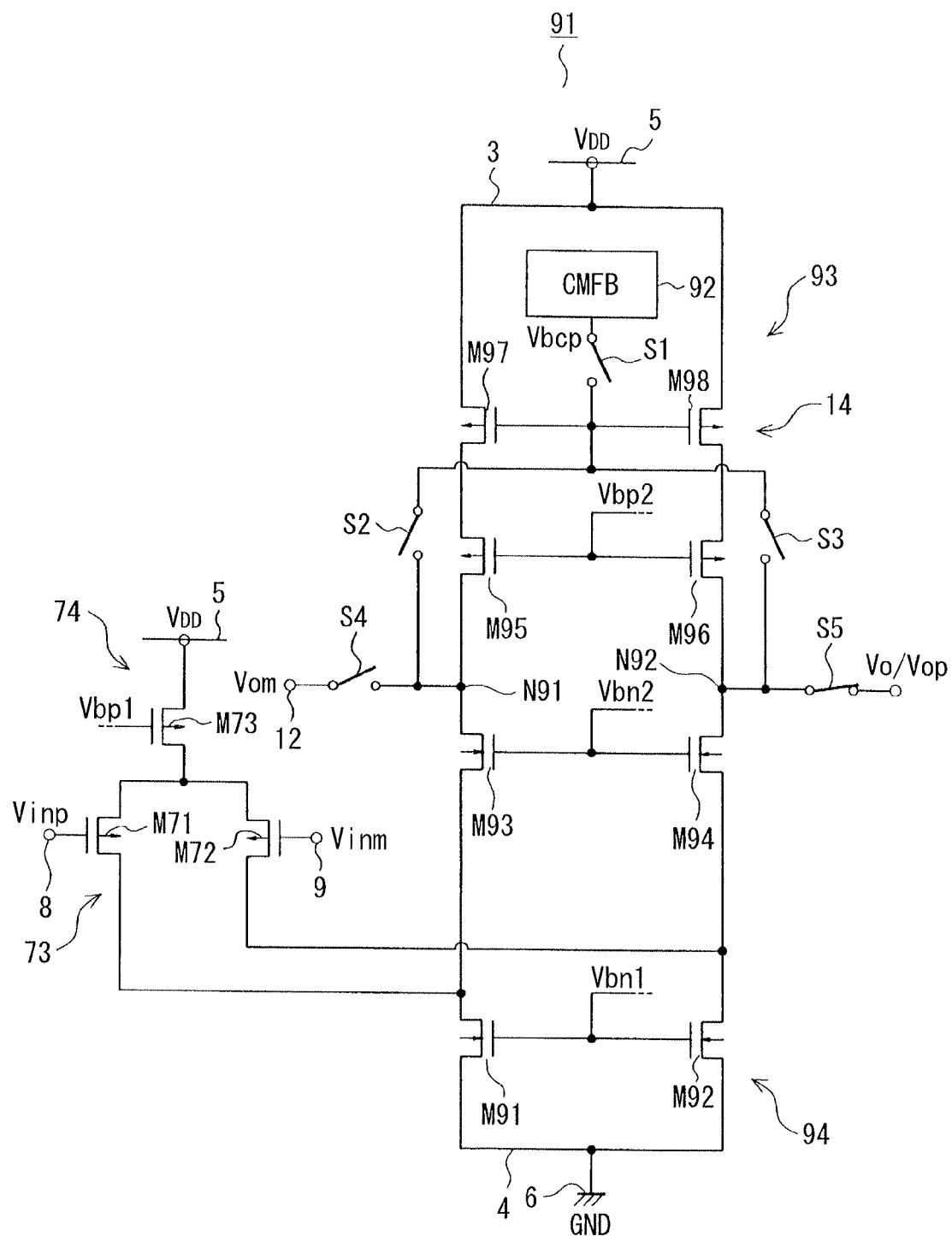
FIG. 15 is an electric circuit diagram showing an amplifier circuit according to a fourth embodiment of the invention.

A fourth embodiment of the present invention is shown in FIG. 15 which is equivalent to FIG. 13 referred to in relation to the second embodiment. and the same elements as in the second embodiment will be marked with the same reference numerals and the description thereof will be omitted.

An amplifier circuit 91 shown in FIG. 15 is provided by changing the mode of the amplifier circuit 71 shown in FIG. 13 to folded cascode connection. The amplifier circuit 91 is different from the amplifier circuit 71 shown in FIG. 13 in that: MOS transistors M91 to M98 are provided in place of the MOS transistors M74, M75 and a CMFB circuit 92 in place of the CMFB circuit 72.

Between the power supply lines 3, 4, the following pairs of transistors are connected in series so that they are vertically stacked: n-channel transistors M91 and M92; n-channel transistors M93 and M94; p-channel transistors M95 and M96; and p-channel transistors M97 and M98. Of these transistors, the transistors M95 to M98 are cascode connected. The transistors M95 to M98 form a load circuit 93 together with a CMFB circuit 92. The load circuit 93 can be switched between a first state in which it operates as an active load on the differential pair 73 and a second state in which it functions as a load on the differential pair 73.

The transistors M91 and M92 form a constant-current circuit 94 for folding back the output current of the differential pair 73 and inputting it to the load circuit 93. To the commonly connected gate of the transistors M91, M92, appropriate bias voltage Vbn1 is supplied. The transistors M93, M94 connected between the load circuit 93 and the constant-current circuit 94 are for suppressing the occurrence of mirror effect at the transistors M71, M72. The sources of these transistors M93, M94 (that is, the drains of the transistors M91, M92) are respectively connected to the drains of the transistors M71, M72. To the commonly connected gate of the transistors M93, M94, appropriate bias voltage Vbn2 is supplied.

The output terminal of the CMFB circuit 92 is connected to the commonly connected gate of the transistors M97, M98 through the switch S1. Between the gate of the transistor M97 and the drain of the transistor M95, the switch S2 is connected. Between the gate of the transistor M98 and the drain of the transistor M96, the switch S3 is connected. The common connection node N91 between the transistor M95 and the transistor M93 is connected to an output terminal 12 through the switch S4. The common connection node N92 between the transistor M96 and the transistor M94 is connected to an output terminal 13 through the switch S5. The nodes N91, N92 are equivalent to the common connection nodes between the differential pair 73 and the load circuit 93.

The CMFB circuit 92 (corresponding to potential applying circuit and in-phase feedback circuit) has the same configuration as that of the CMFB circuit 2 shown in FIG. 1. The CMFB circuit 92 detects the common mode level of balanced signals Vom Vop outputted from the output terminals 12, 13. Then it controls outputted bias voltage Vbcp (corresponding to predetermined potential) so as to match the resulting detection value with a predetermined value.

With this configuration, the amplifier circuit 91 can be operated with a configuration selected from single end output configuration and differential output configuration similarly to the amplifier circuit 71 shown in FIG. 13 by changing the switching state of the switches S1, S2, S4 according to the level of an externally supplied mode switching signal. Therefore, the same operation and advantage as in the second embodiment can be obtained even in the amplifier circuit 91 with folded cascode connection in this embodiment. In addition, adoption of the mode of cascode connection also brings about the effect of enhanced gain in the amplifier circuit 91.

Fifth Embodiment

Figure 16:
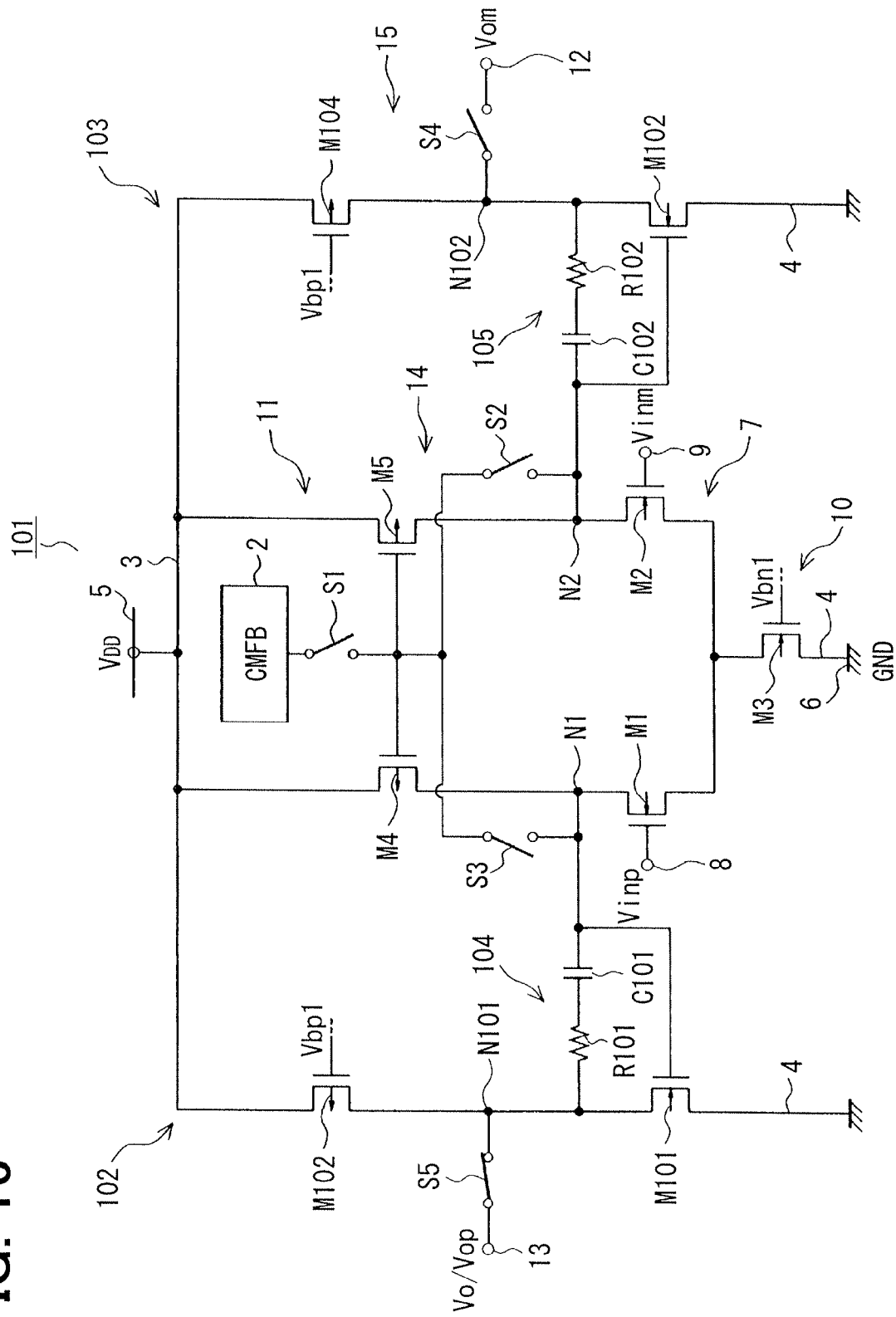
FIG. 16 is an electric circuit diagram showing an amplifier circuit according to a fifth embodiment of the invention.

A fifth embodiment of the present invention is shown in FIG. 16, which is equivalent to FIG. 1 referred to in relation to the first embodiment. The same elements as in the first embodiment will be marked with the same reference numerals and the description thereof will be omitted. An amplifier circuit 101 shown in FIG. 16 is different from the amplifier circuit 1 shown in FIG. 1 in that the connection positions of the switches S2 to S5 are changed and a first amplifier circuit 102 and a second amplifier circuit 103 are added.

The switch S2 is connected between the gate and the drain of the transistor M5. The switch S3 is connected between the gate and the drain of the transistor M4. The first amplifier circuit 102 is formed of an n-channel MOS transistor M101 and a p-channel MOS transistor M102. The gate of the transistor M101 is connected to a common connection node N1. The source of the transistor M101 is connected to the power supply line 4. The source of the transistor M102 is connected to the power supply line 3. The common connection node N101 between the transistors M101, M102 is connected to an output terminal 13 through the switch S5. The gate of the transistor M102 is supplied with appropriate bias voltage Vbp1. Thus the transistor M102 functions as a load on the transistor M101.

A phase compensation circuit 104 is connected between the node N1 and the node N101. The phase compensation circuit 104 is formed of a capacitor C101 and a resistor R101 connected in series and compensates the phase of differential amplification signals. With this configuration, the first amplifier circuit 102 functions as an inverter amplifier. It inverts and amplifies differential amplification signals obtained through the common connection node N1 and outputs the inverted and amplified differential amplification signals from the output terminal 13 through the switch S5.

The second amplifier circuit 103 is formed of an n-channel MOS transistor M103 and a p-channel MOS transistor M104. The gate of the transistor M103 is connected to a common connection node N2. The source of the transistor M103 is connected to the power supply line 4. The source of the transistor M104 is connected to the power supply line 3. The common connection node N102 between the transistors M103, M104 is connected to an output terminal 12 through the switch S4. To the gate of the transistor M104, appropriate bias voltage Vbp1 is supplied. Thus the transistor M104 functions as a load on the transistor M103

A phase compensation circuit 105 is connected between the node N2 and the node N102. The phase compensation circuit 105 is formed of a capacitor C102 and a resistor R102 connected in series and compensate the phase of differential amplification signals. With this configuration, the second amplifier circuit 103 functions as an inverting amplifier. It inverts and amplifies differential amplification signals obtained through the common connection node N2 and outputs the inverted and amplified differential amplification signals from the output terminal 12 through the switch S4.

With this configuration, the amplifier circuit 101 can be operated with a configuration selected from single end output configuration and differential output configuration similarly to the amplifier circuit 1 shown in FIG. 1 by changing the switching state of the switches S1, S2, S4 according to the level of an externally supplied mode switching signal. Therefore, the same operation and advantage as in the first embodiment can be obtained even in the amplifier circuit 101 with two-staged amplifier sections in this embodiment. In addition, configuring the amplifier sections in two stages also brings about the effect of enhanced gain in the amplifier circuit 101.

Other Embodiments

The invention is not limited to the embodiments described above and shown in the drawings but may be modified or expanded as described below.

The switch S3 or S5 need not be provided as long as imbalance between pairs is irrelevant. When the switch S3 is not provided, the portion of the switch S3 has only to be opened. When the switch S5 is not provided, the portion of the switch S5 only has to be short-circuited.

A potential applying circuit that outputs appropriate (optimum) bias voltage (corresponding to predetermined potential) may be provided in place of the CMFB circuit 2, 72, 82, 92.

In the cyclic signal processor circuit 60, the filter operation may be carried out between the C-V conversion operation and the amplification operation or between the amplification operation and the A/D conversion operation. This filter operation can be carried out by, for example, a switched capacitor filter.

The present invention is applicable not only to amplifier circuits having the circuit mode described in relation to each embodiment but also so amplifier circuits having various circuit modes. In the third and fourth embodiments, for example, the number of stages of cascode connected transistors may be changed to three or more. A cascode connected circuit mode without fold-back may be adopted. In the amplifier circuits in the second to fourth embodiments, the amplifier section may be provided with a two-staged configuration as in the fifth embodiment.

What is claimed is:

1. An amplifier circuit comprising:
   differential input transistors forming a differential pair;
   a current supply circuit that supplies a predetermined current to the differential input transistors;
   a load circuit that is switchable between a first state and a second state, the load circuit functioning as an active load on the differential input transistors in the first state and functioning as a load on the differential input transistors in the second state;
   a load switching circuit that switches the load circuit to the first state when a first switching signal is supplied and switches the load circuit to the second state when a second switching signal is supplied; and
   an output switching circuit that causes a differential amplification signal produced through one of common connection nodes between the differential input transistors and the load circuit to be outputted when the first switching signal is supplied and causes the differential amplification signal produced through both of the common connection nodes between the differential input transistors and the load circuit to be outputted when the second switching signal is supplied.

2. The amplifier circuit of claim 1, wherein:
   the output switching circuit includes first and second output changing switches respectively provided between the common connection nodes, which are between the differential input transistors and the load circuit, and first and second output terminals; and
   the output switching circuit is configured to turn the first output changing switch on and the second output changing switch off when the first switching signal is supplied, and turn the first and second output changing switches on when the second switching signal is supplied.

3. The amplifier circuit of claim 1, wherein:
   the load circuit includes paired load transistors and a potential applying circuit that outputs predetermined potential to be supplied to control terminals of the load transistors;
   the paired load transistors have respective control terminals, one main terminals and the other main terminals, the control terminals being connected in common, the one main terminals being connected in common, and the other main terminals being connected to the differential input transistors forming the differential pair;
   the load switching circuit includes first, second and third load changing switches, the first and the second load changing switches being provided between the control terminals connected in common and the other main terminals of the load transistors, respectively, and the third load changing switches being provided between the control terminals connected in common and the other main terminals of the load transistors; and
   the load switching circuit is configured to turn the first load changing switch on and the second and third load changing switches off when the first switching signal is supplied, and turn the first and second load changing switches off and the third load changing switch on when the second switching signal is supplied.

4. The amplifier circuit of claim 3, wherein:
   the potential applying circuit includes an in-phase feedback circuit that detects an output common mode level of the differential amplification signal and controls the predetermined potential so that a resulting detection value agrees with a predetermined value.

5. The amplifier circuit of claim 3, wherein:
   the load transistors are cascade-connected.

6. The amplifier circuit of claim 1, comprising:
   a first amplifier circuit that amplifies differential amplification signals produced through one of the common connection nodes between the differential input transistors and the load circuit; and
   a second amplifier circuit that amplifies differential amplification signals produced through the other of the common connection nodes between the differential input transistors and the load circuit.

7. A signal processor circuit comprising:
   the amplifier circuit of claim 1; and
   a circuit part that performs predetermined signal processing using the amplifier circuit.

8. The signal processor circuit of claim 7, wherein:
   the circuit part is configured to dynamically switch the first switching signal and the second switching signal supplied to the amplifier circuit thereby to change the predetermined signal processing to a plurality of different types of signal processing.

9. The signal processor circuit of claim 7, wherein:
   the predetermined signal processing is carried out by cycling signals through the amplifier circuit.

10. A semiconductor integrated circuit device comprising:
    the amplifier circuit of claim 1.

11. The amplifier circuit of claim 2, wherein:
    the load circuit includes paired load transistors and a potential applying circuit that outputs predetermined potential to be supplied to control terminals of the load transistors;
    the paired load transistors have respective control terminals, one main terminals and the other main terminals, the control terminals being connected in common, the one main terminals being connected in common, and the other main terminals being connected to the differential input transistors forming the differential pair;
    the load switching circuit includes first, second and third load changing switches, the first and the second load changing switches being provided between the control terminals connected in common and the other main terminals of the load transistors, respectively, and the third load changing switches being provided between the control terminals connected in common and the other main terminals of the load transistors; and
    the load switching circuit is configured to turn the first load changing switch on and the second and third load changing switches off when the first switching signal is supplied, and turn the first and second load changing switches off and the third load changing switch on when the second switching signal is supplied.

* * * * *